United States Patent
Nam

(10) Patent No.: US 10,340,943 B2
(45) Date of Patent: Jul. 2, 2019

(54) DATA CONVERSION APPARATUS AND METHOD

(71) Applicant: SK hynix Inc., Gyeonggi-do (KR)

(72) Inventor: Ji-Hoon Nam, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 89 days.

(21) Appl. No.: 15/795,497

(22) Filed: Oct. 27, 2017

(65) Prior Publication Data

US 2018/0287628 A1 Oct. 4, 2018

(30) Foreign Application Priority Data

Apr. 4, 2017 (KR) .................. 10-2017-0043660

(51) Int. Cl.
*H03M 7/14* (2006.01)
*H03M 7/30* (2006.01)

(52) U.S. Cl.
CPC ............... *H03M 7/14* (2013.01); *H03M 7/30* (2013.01)

(58) Field of Classification Search
CPC ............ H03M 7/14; H03M 7/30; H03M 7/60; G11C 11/5628; G11C 16/0483; G11C 16/08
USPC ............................................ 341/51, 87, 106
See application file for complete search history.

(56) References Cited

U.S. PATENT DOCUMENTS 9,148,172 B2 *  9/2015  Manning ................. H03M 7/30
9,209,832 B2 * 12/2015  Alhussien ........... H03M 13/618

FOREIGN PATENT DOCUMENTS

KR     1020110100347    9/2011
KR         101618925    5/2016

* cited by examiner

*Primary Examiner* — Khai M Nguyen
(74) *Attorney, Agent, or Firm* — IP & T Group LLP

(57) ABSTRACT

A data conversion apparatus may include: a receiver suitable for receiving input data; and a controller suitable for selectively converting the input data based on a distribution of a preset bit value included in the input data, and outputting any one of the input data and the converted data as output data, the converted data having a smaller size than the input data.

20 Claims, 16 Drawing Sheets

| index | data |
|---|---|
| 0 | 11111111 |
| 1 | 11111110 |
| 2 | 11111101 |
| 3 | 11111100 |
| ⋮ | ⋮ |
| 14 | 10101111 |
| 15 | 01111111 |

FIG. 13

| Data bits | Index value |
|---|---|
| 8 | 4 |
| 16 | 8 |
| 32 | 16 |

FIG. 14

| Max Index | Min Index | IND | Loc | |
|---|---|---|---|---|
| Index : Data | Index : Data | | | |
| 64 : 0<br>256bits | 17 : 47<br>444bits | 64 | 1 | ~1410 |
| 32 : 0<br>256bits | 9 : 23<br>440bits | 32 | 1 | ~1420 |
| 16 : 0<br>256bits | 5 : 11<br>432bits | 16 | 1 | ~1430 |

DATA CONVERSION APPARATUS AND METHOD

CROSS-REFERENCE TO RELATED APPLICATIONS

The present application claims priority of Korean Patent Application No. 10-2017-0043660, filed on Apr. 4, 2017, which is incorporated herein by reference in its entirety.

BACKGROUND

1. Field

Various embodiments relate to a data conversion apparatus and method used for a memory system.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory device or an auxiliary memory device of a portable electronic device.

A memory device has excellent stability and durability because it does not include a mechanical driving unit. Also, the memory device is advantageous in that it may access data quickly and consume a small amount of power. Non-limiting examples of a memory device having these advantages include a universal serial bus (USB) memory device, a memory card with diverse interfaces, and a solid state drive (SSD).

SUMMARY

Various embodiments are directed to a data conversion apparatus and method used for a memory system.

In an embodiment, a data conversion apparatus may include: a receiver suitable for receiving input data; and a controller suitable for selectively converting the input data based on a distribution of a preset bit value included in the input data, and outputting any one of the input data and the converted data as output data, the converted data having a smaller size than the input data.

In an embodiment, a data conversion method may include: receiving input data; selectively converting the input data based on a distribution of a preset bit value included in the input data; and outputting any one of the input data and the converted data as output data, the converted data having a smaller size than the input data.

BRIEF DESCRIPTION OF THE DRAWINGS

The above and other features and advantages of the present invention will become more apparent to those skilled in the art to which the present invention pertains by the following detailed description with reference to the attached drawings in which:

FIG. 13 is a table illustrating the relationship between input data bits and index values in a data conversion apparatus in accordance with embodiments;

FIG. 14 is a table illustrating various information included in output data in a data conversion apparatus in accordance with embodiments;

DETAILED DESCRIPTION

Various embodiments will be described below in more detail with reference to the accompanying drawings. The following descriptions will be focused on portions which are required for understanding operations in accordance with the present embodiments, and the descriptions of the other portions will be omitted in order not to unnecessarily obscure subject matters of the present an embodiment of the present invention Hereinafter, the various embodiments of the present invention will be described in detail with reference to the attached drawings.

Figure 1:
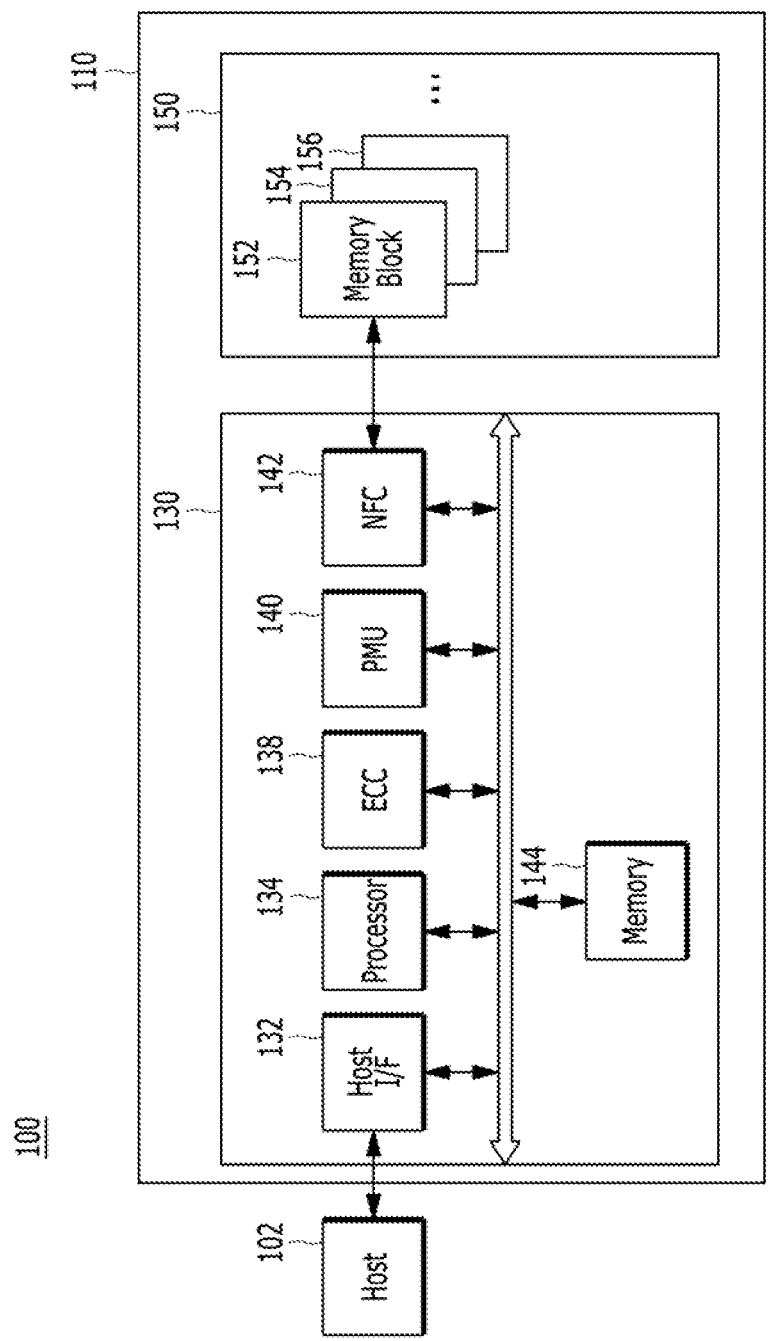
FIG. 1 is a block diagram illustrating a data processing system including a memory system in accordance with an embodiment of the present invention.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may be any suitable electronic device including portable electronic devices such as a mobile phone, MP3 player and laptop computer or non-portable electronic devices such as a desktop computer, game machine television (TV) and projector. The host 102 may include at least one operating system (OS), and the OS may manage and control the overall functions and operations of the host 102, and also provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include one or more of Oss. The host 102 may execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, universal storage bus (USB) device, a universal flash storage (UFS) device, compact flash (CF) card, a smart media card (SMC), a personal computer memory card international association (PCMCIA) card and memory stick. The MMC may include an embedded MMC (eMMC) reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM) a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-books a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown) each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 139 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-e), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 is an example of a memory/storage interface for interfacing the controller 130 and the memory device 150 when the memory device is a NAND flash memory, such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. Other memory/storage interfaces may be used when a different type memory device is employed.

The memory 144 may serve as a working memory of the memory system 110 and the controller 130 and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
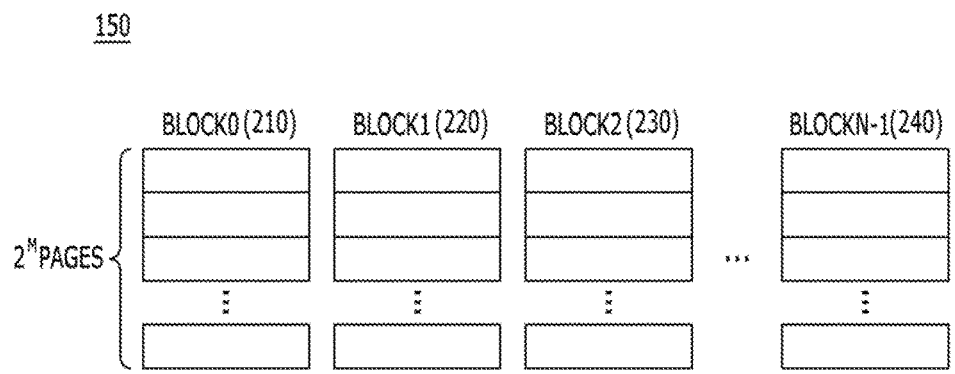
FIG. 2 is a schematic diagram illustrating an exemplary configuration of a memory device employed in the memory system shown in FIG. 1.

FIG. 2 is a schematic diagram illustrating an exemplary configuration of the memory device 150 employed in the memory system 110 shown in FIG. 1.

Referring to FIG. 2, the memory device 150 may include a plurality of memory blocks 0 to N−1 and each of the blocks 0 to N−1 may include a plurality of pages, for example $2^M$ pages the number of which may vary according to circuit design. Memory cells included in the respective memory blocks 0 to N−1 may be one or more of a single level cell (SLC) storing 1-bit data, a multi-level cell (MLC) storing 2-bit data, an MLC storing 3-bit data also referred to as a triple level cell (TLC), an MLC storing 4-bit data also referred to as a quadruple level cell (QLC), or an MLC storing 5-bit or more bit data.

Figure 3:
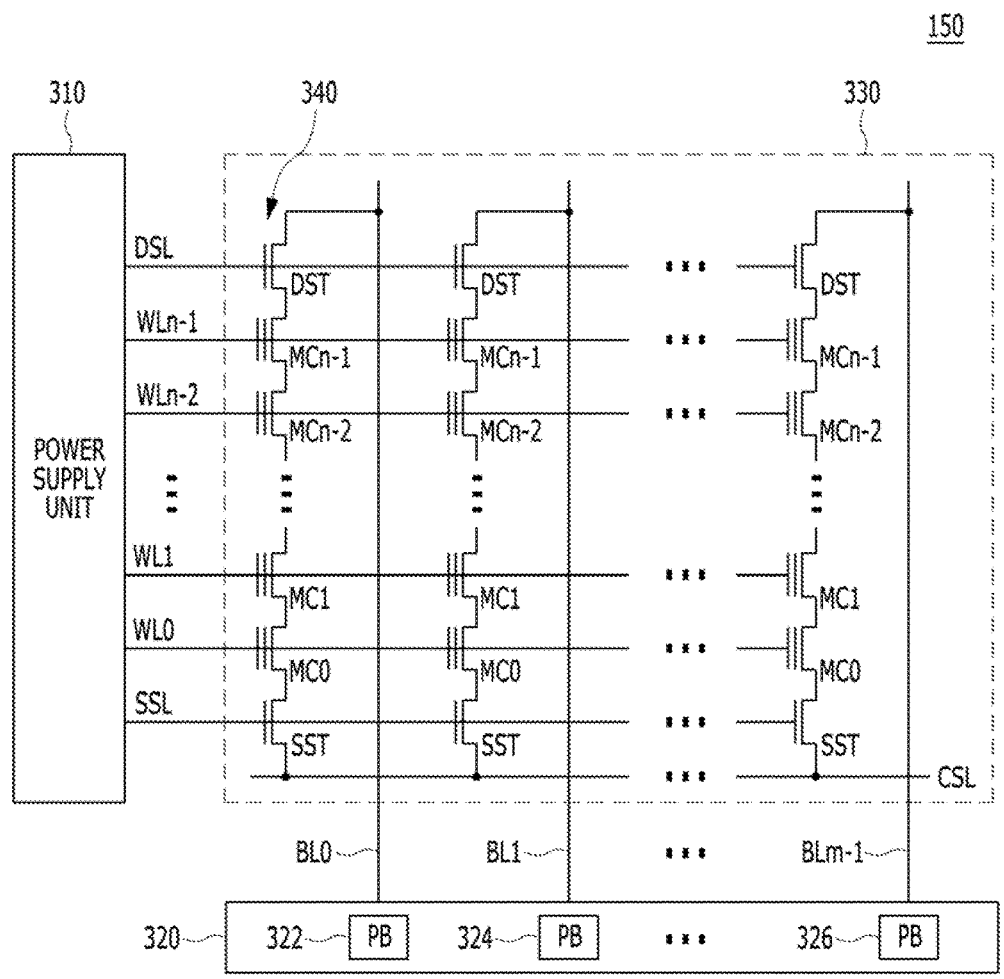
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150 of FIG. 2.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm-1. The cell string 340 of each column may include one or more drain select transistors DST and one or more source select transistors SST. Between the drain and select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. For example, it is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
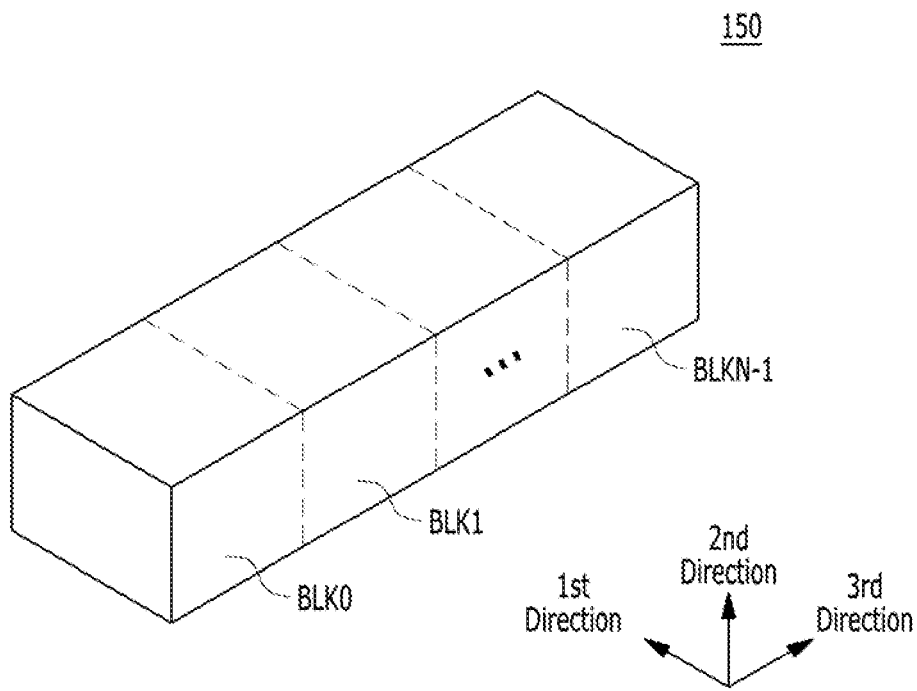
FIG. 4 is a schematic diagram illustrating an exemplary three-dimensional structure of the memory device shown in FIG. 2.

FIG. 4 is a schematic diagram illustrating an exemplary three-dimensional (3D) structure of the memory device 150 of FIG. 2.

The memory device 150 may be embodied by a two-dimensional (2D) or three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

As described above, the memory system may perform an operation on a memory device in response to a request received from a host. For example, the memory system may write or store data provided from the host into a cell of the memory device in response to a write request received from the host. Memory cells included in a memory device such as phase change memory (PCM) or NAND flash have a short lifetime due to low endurance. Therefore, there is a demand for a method capable of expanding the lifetime of a memory cell, and reducing power consumption required for changing data of the memory cell.

The following embodiments propose a method for converting bit values which are to be stored in a memory device such as PCM or NAND flash. For example, when the bit value of data written to a cell is "1", the lifetime of the cell may be reduced. Therefore the following embodiments propose a method for changing data written to a cell into a value close to "0". The data conversion methods in accordance with the following embodiments may be applied to a memory device such as PCM or NAND flash, but not limited thereto.

Figure 5:
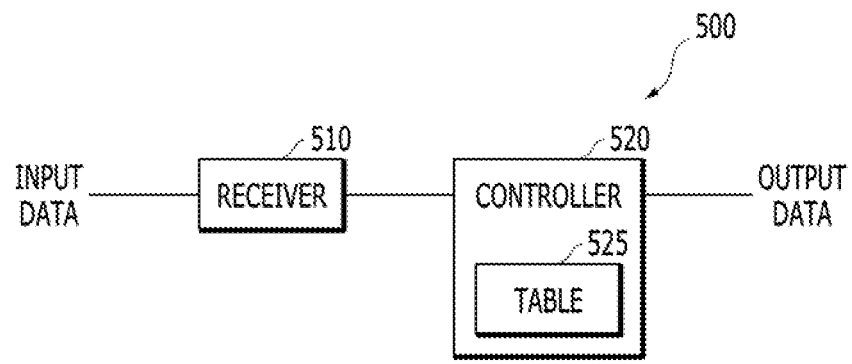
FIG. 5 is a diagram illustrating the configuration of a data conversion apparatus in accordance with embodiments.

FIG. 5 is a diagram illustrating a data conversion apparatus 500 in accordance with an embodiment of the present invention.

Referring to FIG. 5, the data conversion apparatus 500 may include a receiver 510 and a controller 520. When the data conversion apparatus 500 is applied to the memory system 110 illustrated in FIG. 1, the receiver 510 and the controller 520 may correspond to the host interface 132 and the processor 134 which are illustrated in FIG. 1, respectively.

The receiver 510 may receive input data. The controller 520 may selectively convert the input data based on a distribution of a preset bit value included in the input data, and output any one of the input data and the converted data having a smaller size than the input data as output data.

When the distribution of the preset bit value included in the input data exceeds a preset ratio, the controller 520 may convert the input data, and output the output data OUTPUT DATA which include the converted data. In an embodiment, the preset bit value may correspond to a bit value having a logic level of "1", and the preset ratio may range from 15% to 20%.

In an embodiment, the output data may include flag information and the converted data. The flag information may indicate whether the output data includes only the input data.

In accordance with an embodiment the controller 520 may include a table 525 for storing index values corresponding to a series of bit values included in the input data. For example, the table 525 may store 4-bit index values corresponding to 8-bit values. When the distribution of the preset bit value exceeds the preset ratio, the controller 520 may output an index value corresponding to a bit value included in the input data as the converted data, by referring to the table 525.

In another embodiment, when the distribution of the preset bit value included in the input data exceeds the preset ratio, the controller 520 may divide the input data into a plurality of partial data including first and second partial data. For example, the controller 520 may divide 512-bit input data into a plurality of 8-bit partial data. The controller 520 may convert the first partial data, and output the output data including the converted data and the second partial data.

In accordance with another embodiment, the output data may include the flag information, the converted data, the second partial data and indication information. The flag information may indicate whether the output data includes only the input data. The indication information may indicate that the first partial data is converted data and the second partial data is non-converted data. The output data may further include padding information.

In accordance with another embodiment, the controller 520 may include a table 525 for storing index values corresponding to a series of bit values included in each of a plurality of partial data. When the distribution of the preset bit value exceeds the preset ratio, the controller 520 may output an index value corresponding to a bit value included in the corresponding partial data as the converted data, by referring to the table 525.

In accordance with another embodiment, the locations of the converted data, the second partial data and the indication information in the output data may be variably set. In this case, the output data may further include location information indicating the locations of the converted data, the second partial data and the indication information in the output data. For example, in the output data, the converted data and the second partial data may be located in a first region, the indication information may be located in a second region, and the location information may be located in a third region. For another example, in the output data, the indication information may be located in the first region, the converted data and the second partial data may be located in the second region, and the location information may be located in the third region.

Figure 6:
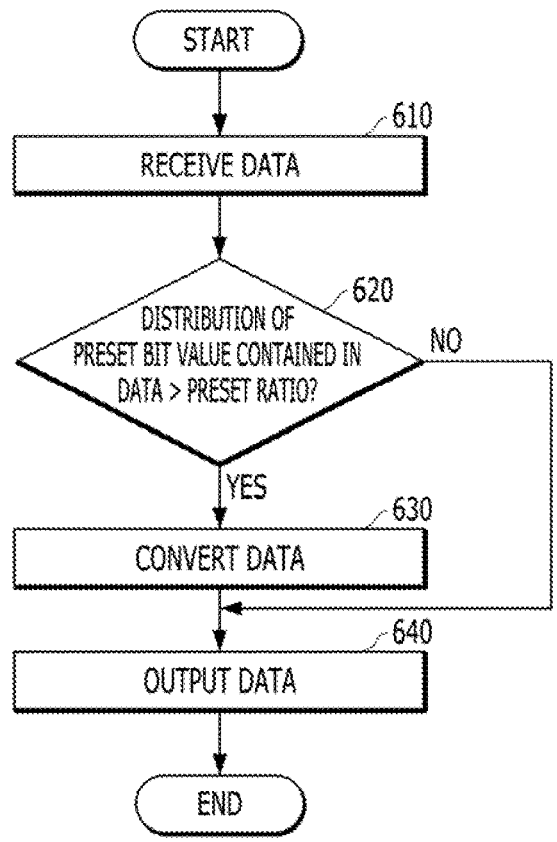
FIG. 6 is a flowchart illustrating a data conversion operation in accordance with embodiments.

FIG. 6 is a flowchart illustrating a data conversion operation in accordance with an embodiment of the present invention. The data conversion operation of FIG. 6 may be performed by the receiver 510 and the controller 520 of the data conversion apparatus 500 illustrated in FIG. 5.

Referring to FIG. 6, the data conversion operation may include steps 610 to 640. At step 610, the receiver 510 may receive input data. The controller 520 may selectively convert the input data based on a distribution of a preset bit value included in the input data.

At step 620, the controller 520 may determine whether the distribution of the preset bit value included in the input data exceeds an acceptable preset ratio. In an embodiment, the preset bit value may correspond to a bit value having a logic level of "1", and an acceptable preset ratio may range from 15% to 20% of the bit value. When the distribution of the preset bit value exceeds the preset ratio, the procedure may proceed to step 630. Otherwise, the procedure may proceed to step 640.

At step 630, the controller 520 may convert the input data, when the distribution of the preset bit value included in the input data exceeds the preset ratio. At step 640, the controller 520 may output any one of the converted data and the input data as output data.

In the present embodiment, the output data may include flag information and the converted data. The flag information may indicate whether the output data includes only the input data. In the case that the flag information indicates that the output data includes not only converted data, then the output data may also include additional information as described above, including information about the locations of the converted data and the other data and information.

In an embodiment, when the distribution of the preset bit value included in the input data exceeds the preset ratio, the controller 520 may divide the input data into a plurality of partial data including first and second partial data.

In an embodiment, the output data may include the flag information, the converted data, the second partial data and indication information. The flag information may indicate whether the output data includes only the input data. The indication information may indicate that the first partial data is converted data and the second partial data is non-converted data. The output data may further include padding information.

Figure 7:
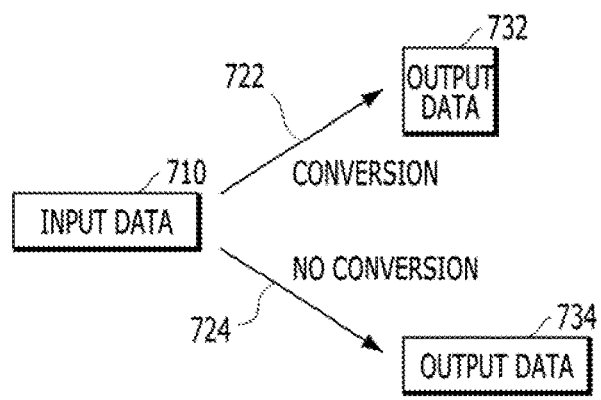
FIG. 7 is a diagram illustrating a flow of a data conversion operation in accordance with embodiments.

FIG. 7 is a diagram illustrating a flow of a data conversion operation in accordance with an embodiment of the present invention. The data conversion operation of FIG. 7 may be performed by the data conversion apparatus 500 illustrated in FIG. 5.

Referring to FIG. 7, input data 710 may be converted by a conversion operation 722 and then outputted as output data 732, or outputted as output data 734 with no conversion 724. The input data 710 may be selectively converted based on a distribution of a preset bit value included in the input data 710. For example, when the distribution of the preset bit value included in the input data 710 exceeds a preset ratio, the conversion 722 may be performed. Otherwise, no conversion 724 may be performed.

In an embodiment, the preset bit value may correspond to a bit value having a logic level of "1", and the preset ratio may range from 15% to 20%. For example, when the input data 710 including the bit values of "1" at the preset ratio or more is stored in a memory cell, the lifetime of the memory cell is highly likely to shorten. Thus, the input data 710 may be converted into the output data 732 having a smaller size, in order to minimize the number of bit values of "1". On the other hand, when the input data 710 which does not include the bit values of "1" at the preset ratio or more is stored in a memory cell, the lifetime of the memory cell is unlikely to shorten. Thus, the input data 710 may be outputted as the output data 734 without conversion.

Figure 8:
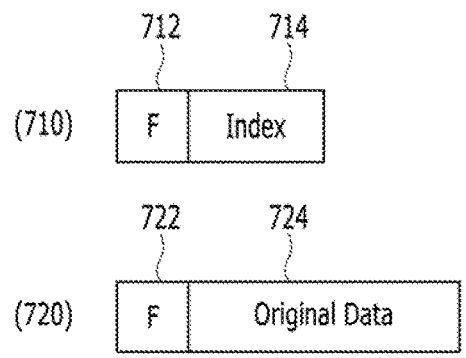
FIG. 8 is a diagram illustrating the structures of output data by a data conversion operation in accordance with an embodiment.

FIG. 8 is a diagram illustrating the structures of output data by a data conversion operation in accordance with an embodiment. The output data of FIG. 8 may be generated by the controller 520 of the data conversion apparatus 500 illustrated in FIG. 5.

Referring to FIG. 8, the output data 710 may include flag information 712 and index information 714 serving as converted data. The flag information 712 may indicate whether the output data 710 does not include only input data. Alternatively, the output data 720 may include flag information 722 and original input data 724. The flag information 722 may indicate whether the output data 720 includes only input data 724.

Figure 9:
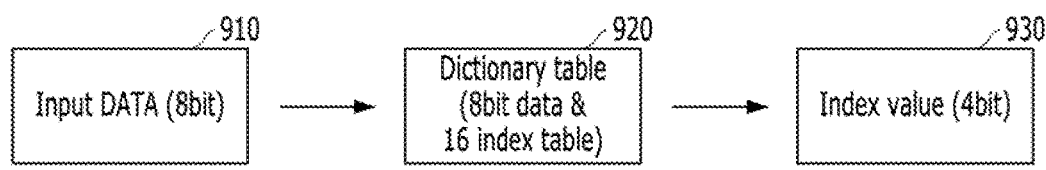
FIG. 9 is a diagram illustrating an example of a data conversion operation in accordance with an embodiment.

FIG. 9 is a diagram illustrating an example of a data conversion operation in accordance with an embodiment. The data conversion operation of FIG. 9 may be performed by the controller 520 of the data conversion apparatus 500 illustrated in FIG. 5.

Referring to FIG. 9, the controller 520 may include a dictionary table 920 for storing index values corresponding to a series of bit values included in input data 910. For example, the table 920 may store 16 index values corresponding to 16 8-bit values. The number of index values included in the table 920 may be properly set in consideration of the case in which the lifetime of a memory cell is highly likely to shorten as the input data 910 is stored in the memory cell. The controller 520 may output a 4-bit index value 930 corresponding to an 8-bit value included in the input data 910 as converted data, by referring to the table 920.

When the input data [7:0] is "11111111", the controller 520 may output "0000" corresponding to the index 0 by referring to the table 920. When the input data [15:8] is "01111111", the controller 520 may output "1111" corresponding to the index 15 by referring to the table 920.

In an embodiment, the information stored in the table 920 can be configured to be updated. For example, when the data conversion apparatus is applied to a memory system, the information can be configured in a suitable form depending on the bit number of processed input data and the bit number of an index value. For example, the input data may include 16-bit data and the index value may include an 8-bit value. For another example the input data may include 32-bit data, and the index value may include a 16-bit value.

Figure 10:
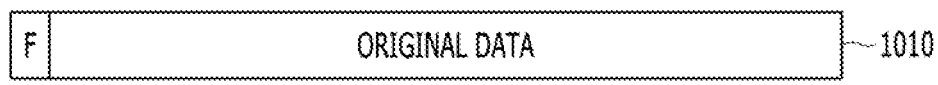
FIG. 10 is a diagram illustrating the structures of output data by a data conversion operation in accordance with another embodiment.
Figure 10:
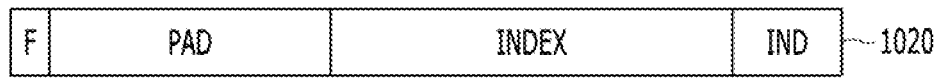
Figure 10:
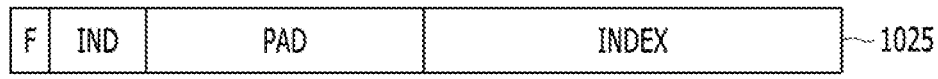
Figure 10:
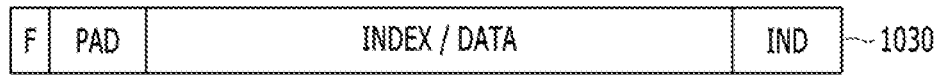
Figure 10:
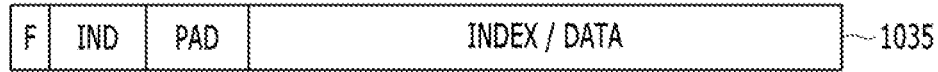

FIG. 10 is a diagram illustrating the structures of output data by data conversion operation in accordance with another embodiment. The output data of FIG. 10 may be generated by the controller 520 of the data conversion apparatus 500 illustrated in FIG. 5.

Referring to FIG. 10, the output data 1010 may include flag information F and original data. The flag information F may indicate that the output data 1010 include only input data.

The output data 1020, 1025, 1030 and 1035 may include flag information F, an index INDEX serving as converted data, second partial data DATA, and indication data IND. The flag information F may indicate that the output data do not include only input data. When the input data is divided into a plurality of partial data including first and second partial data, the indication information IND may indicate that the first partial data is converted data and the second partial data is non-converted data. The output data 1020, 1025, 1030 and 1035 may further include padding information PAD.

In the output data 1020, 1025, 1030 and 1035, the locations of the converted data INDEX, the second partial data DATA and the indication information IND may be variably set. The output data 1020 and 1025 may correspond to data which include indexes as converted data, because all of the input data were converted into the index values. On the other hand, the output data 1030 and 1035 may correspond to data which include indexes as partial data, because partial data of input data were converted into the index values.

For example, in the output data 1020, the flag information F may be located at the head, the padding information PAD may be located next to the flag information F, the converted data INDEX may be located next to the padding information PAD, and the indication information IND may be located next to the converted data INDEX. In the output data 1030, the flag information F may be located at the head, the padding information PAD may be located next to the flag information F, the converted data INDEX and the second partial data DATA may be located next to the padding information PAD, and the indication information IND may be located next to the converted data INDEX and the second partial data DATA. In the output data 1025, the flag information F may be located at the head, the indication information IND may be located next to the flag information F, the padding information PAD may be located next to the indication information IND, and the converted data INDEX may be located next to the padding information PAD. In the output data 1035, the flag information F may be located at the head, the indication information IND may be located next to the flag information F, the padding information PAD may be located next to the indication information IND, and the converted data INDEX and the second partial data DATA may be located next to the padding information PAD.

Figure 11:
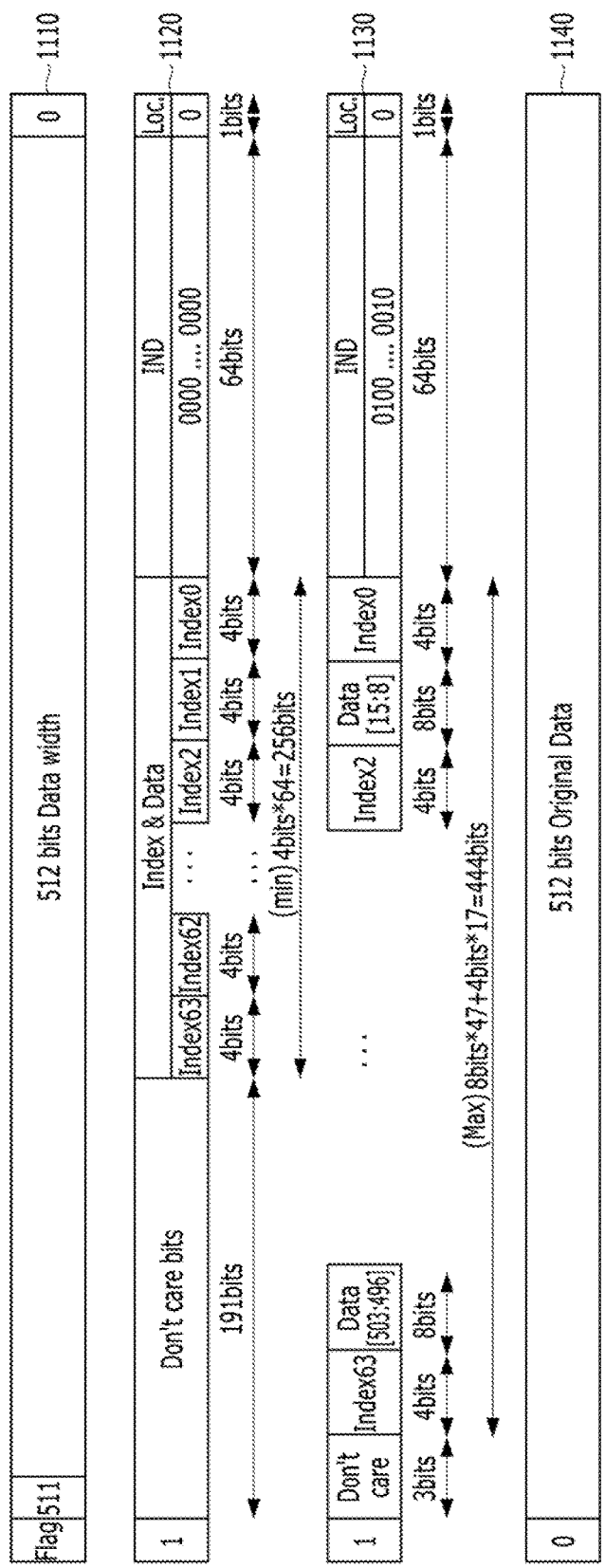
FIG. 11 is a diagram illustrating an example of a data conversion operation in accordance with an embodiment.

FIG. 11 is a diagram illustrating an example of a data conversion operation in accordance with an embodiment. The data conversion operation of FIG. 11 may correspond to the case in which the controller 520 of the data conversion apparatus 500 illustrated in FIG. 5 selectively converts 512-bit input data and outputs the converted data as output data.

Referring to FIG. 11, the output data 1110 may include flag information F and 512-bit data. The output data 1120 and 1130 may correspond to the case in which input data are converted and outputted. The output data 1120 may include indexes as converted data, as all of the input data are converted into index values. On the other hand, the output data 1130 may include indexes as partial data of the input data, as the partial data are converted into index values. Furthermore, the output data 1130 may include the other partial data without conversion.

The output data 1140 may correspond to the case in which input data are included without conversion. The output data 1140 may include first and second regions. The first region may include flag information having a bit value of "0", and the second region may include 512-bit original data. The flag information having a bit value of "0" may indicate that the output data 1140 do not include converted data, but include only the input data.

The output data 1120 may include first to fourth regions. The first region may include flag information having a bit value of "1". The second region may include don't-care bits as padding information. The third region may include indexes INDEX as converted data. The fourth region may include indication information IND.

In the output data 1120, the flag information having a bit value of "1" may indicate that the output data do not include only input data. The indexes may correspond to results obtained by converting partial data into 4-bit index values, the partial data being formed by dividing 512-bit input data into a plurality of 8-bit partial data (for example, 64 8-bit partial data). That is, the first partial data may be converted into an index Index0, the second partial data may be converted into an index Index1, the third partial data may be converted into an index Index2, the 63rd partial data may be converted into an index Index62, and the 64th partial data may be converted into an index Index63. Therefore, the 512-bit input data can be converted into 256-bit (=4 bits*64) indexes having a smaller size than the 512-bit input data.

In the output data 1120, the indication information IND may include bits corresponding to the plurality of partial data, and indicate whether the respective partial data have been converted or not. For example, a bit value of "0" may indicate that the corresponding partial data has been converted into an index, and a bit value of "1" may indicate that the corresponding partial data has not been converted into an index. Here, since the 64 partial data were all converted into the index values, the indication information may include 64 bits having a value of "0".

The fifth region of the output data 1120 may include location information Loc. When the indication information IND is fixedly located and includes a large number of "0" bit values, it is not advantageous in terms of cell endurance. In order to solve the problem, the location where the indication information is stored may be varied. The location information Loc. may include 1-bit information indicating where the indication information Loc. is included in the output data 1120. For example, the location information Loc. having a bit value of "0" may indicate that the indication information Loc, is located in the least significant bit (LSB) of the output data 1120. That is, the location information Loc. may indicate that the flag information, the padding information, the indexes INDEX and the indication information IND are sequentially located from the head of the output data 1120.

When the bit values included in the respective regions of the output data 1120 are decided, the number of don't-care bits included in the second region may also be decided. For example, the second region of the output data 1120 may include 191 bits.

The output data 1130 may include first to fourth regions. The first region may include flag information having a bit value of "1". The second region may include don't-care bits as padding information. When the input data are divided into a plurality of partial data including first and second partial data, the third region may include indexes and the second partial data, the indexes serving as converted data of the first partial data. The fourth region may include indication information IND.

In the output data 1130, the flag information having a bit value of "1" may indicate that the output data do not include only input data. The indexes included in the third region may correspond to results obtained by converting a part of partial data into 4-bit index values, the partial data being formed by dividing 512-bit input data into a plurality of 8-bit partial data (for example, 64 8-bit partial data). In other words, the data included in the third region may correspond to the case in which the 512-bit input data are divided into a plurality of 8-bit partial data (for example, 64 8-bit partial data) and a part of the partial data is included without conversion. That is, the first partial data may be converted into an index Index0, the second partial data may be included as data Data[15:8], the third partial data may be converted into an index Index2, the 63rd partial data may be included as data Data[503:496], and the 64th partial data may be converted into an index Index63. Therefore, the 512-bit input data may be converted into 444-bit (=8 bits*47+4 bits*17) Indexes having a smaller size than the 512-bit input data.)

In the output data 1130 the indication information may include bits corresponding to the plurality of partial data, and indicate whether the respective partial data have been converted or not. For example, a bit value of "0" may indicate that the corresponding partial data has been converted, and a bit value of "1" may indicate that the corresponding partial data has not been converted. Here, since a part of the 64 partial data, for example, 17 partial data have been converted into the index values, the indication information may include 17 bits having a value of "0" and 47 bits having a value of "1".

The fifth region of the output data 1130 may include location information Loc. When the indication information Loc. is fixedly located and includes a large number of "0" bit values, it is not advantageous in terms of cell endurance. In order to solve the problem, the location where the indication information is stored may be varied. The location information Loc. may indicate where the indication information is included in the output data 1130. For example, the location information Loc. having a bit value of "0" may indicate that the indication information IND is located in the LSB of the output data 1130. That is, the location information Loc. may indicate that the flag information, the padding information, the indexes INDEX and the indication information IND are sequentially located from the head of the output data 1130.

When the bit values included in the respective regions of the output data 1130 are decided, the number of don't-care bits included in the second region may also be decided. For example the second region of the output data 1130 may include 3 bits (=512−444−64−1).

Figure 12:
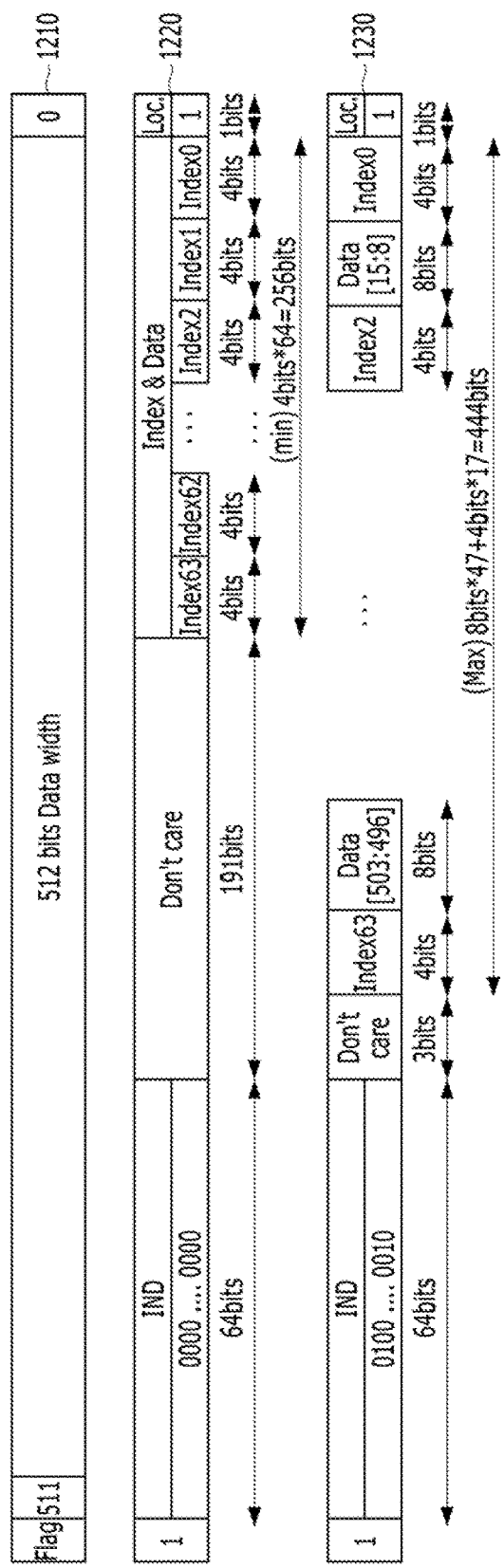
FIG. 12 is a diagram illustrating another example of a data conversion operation in accordance with an embodiment.

FIG. 12 is a diagram illustrating another example of a data conversion operation in accordance with an embodiment. The data conversion operation of FIG. 12 may correspond to the case in which the controller 520 of the data conversion apparatus 500 illustrated in FIG. 5 selectively converts 512-bit input data and outputs the converted data as output data.

Referring to FIG. 12, the output data 1210 may include flag information F and 512-bit data. The output data 1220 and 1230 may correspond to the case in which input data are converted and outputted. The output data 1220 may include indexes as converted data, as the input data are all converted into index values. On the other hand, the output data 1230 may include indexes as partial data of the input data, as the partial data are converted into index values. Furthermore, the output data 1230 include the other partial data without conversion.

The output data 1220 and the output data 1230 may include the same information as the information included in the output data 1120 and the output data 1130 which are illustrated in FIG. 11, respectively. Therefore, the detailed descriptions of the information are omitted herein. However, the location where indication information IND is stored may be different therebetween. That is, the indication information IND included in each of the output data 1120 and 1130 illustrated in FIG. 11 may be located at the LSB of the corresponding output data. On the other hand, the indication information IND included in each of the output data 1220 and 1230 illustrated in FIG. 12 may be located at the most significant bit (MSB) of the corresponding output data. The reason to change the location of the indication information IND is in order to improve the cell endurance which may be degraded when the indication information that may include a large number of "0" bit values is included at a fixed location.

The fifth regions of the output data 1220 and 1230 may include location information Loc. For example, the location information Loc. having a bit value of "1" may indicate that the indication information IND is located at the MSBs of the output data 1220 and 1230. The location information Loc. may indicate that the flag information, the indication information IND, the padding information and the indexes INDEX are sequentially located from the head of the output data 1220, and indicate that the flag information, the indication information IND, the padding information and the indexes INDEX/data are sequentially located from the head of the output data 1230.

FIG. 13 is a table illustrating the relationship between input data bits and index values in a data conversion apparatus in accordance with an embodiment of the present invention Referring to FIG. 13, the bit number of the index values included in the table 525 may be decided in response to the bits of the input data received by the controller 520 of FIG. 5. When the input data includes 8 bits, the bit number of the index values corresponding to converted data may be set to 4 bits. When the input data includes 16 bits, the bit number of the index value corresponding to converted data may be set to 8 bits. When the input data includes 32 bits, the bit number of the index value corresponding to converted data may be set to 16 bits.

FIG. 14 is a table illustrating various information included in output data in a data conversion apparatus in accordance with an embodiment of the present invention Referring to FIG. 14, the output data may include various information such as indexes Index/data Data, indication information IND and location information Loc as described with reference to FIGS. 11 and 12.

When input data are divided into a plurality of partial data and then selectively converted and outputted, the bit number of the indication information IND and location information Loc included in the output data may be fixedly set. For example, when 512-bit input data are divided into 64 8-bit partial data and an index value corresponding to the 8-bit partial data includes 4 bits (1410), the indication information IND may be set to 64 bits, and the location information Loc may be set to 1 bit. For another example, when 512-bit input data are divided into 32 16-bit partial data and an index value corresponding to the 16-bit partial data includes 8 bits (1420), the indication information IND may be set to 32 bits, and the location information Loc may be set to 1 bit. For another example, when 512-bit input data are divided into 16 32-bit partial data and an index value corresponding to the 32-bit partial data includes 16 bits (1430), the indication information IND may be set to 16 bits, and the location information Loc may be set to bit.

On the other hand, the numbers of indexes and data included in the output data may differ depending on a distribution of a specific bit (for example, "1" bit) included in the partial data. When no partial data are included in the output data or when all partial data are converted, the number of indexes for the partial data included in the output data may be maximized. For example, in the case of 1410, the output data may include 64 4-bit indexes or index values corresponding to 256 bits. For another example, in the case of 1420, the output data may include 32 8-bit indexes or index values corresponding to 256 bits. For another example, in the case of 1430, the output data may include 16 16-bit indexes or index values corresponding to 256 bits.

When the output data include converted data corresponding to a part of the partial data and original partial data which are not converted, or when all of the partial data are not converted, an equation of $(X+Y=Z)$ may be established. Here, Z represents the number of partial data divided from the input data, X represents the number of indexes for a part of the partial data included in the output data, and Y represents the number of original partial data which are not converted.

In the case of 1410, relations of $(X+Y=64)$ and $(4X+8Y=512-64-1)$ may be established. Here 64 may represent the number of partial data divided from the 512-bit input data, 4 may represent the bit number of the index, 8 may represent the bit number of the original partial data, 512 may represent the width of the data, 64 may represent the bit number of the indication information, and 1 may represent the bit number of the location information. The minimum number of indexes, which satisfies the above equations, is 17 ($X=17$), and the number of original partial data, which satisfies the above equations, is 47 ($Y=47$). In this case, the bit number of the indexes and original partial data may be set to 444 bits.

In the case of 1420, relations of $(X+Y=32)$ and $(4X+8Y=512-32-1)$ may be established. Here, the first 32 may represent the number of partial data divided from the 512-bit input data, 8 may represent the bit number of the index 4 may represent the bit number of the original partial data, 512 may represent the width of the data, the second 32 may represent the bit number of the indication information, and 1 may represent the bit number of the location information. The minimum number of indexes, which satisfies the above equations, is 9 ($X=9$), and the number of original partial data, which satisfies the above equations is 23 (Y=23). In this case, the bit number of the indexes and original partial data may be set to 440 bits.

In the case of 1430, relations of X+Y=16 and (16X+32Y=512−16−1) may be established. Here, the first 16 may represent the number of partial data divided from the 512-bit input data, the second 16 may represent the bit number of the index, 32 may represent the bit number of the original partial data, 512 may represent the width of the data, the third 16 may represent the bit number of the indication information, and 1 may represent the bit number of the location information. The minimum number of indexes, which satisfies the above equations, is 5 (X=5) and the number of original partial data, which satisfies the above equations, is 11 (Y=11). In this case, the bit number of the indexes and original partial data may become 432 bits.

Figure 15:
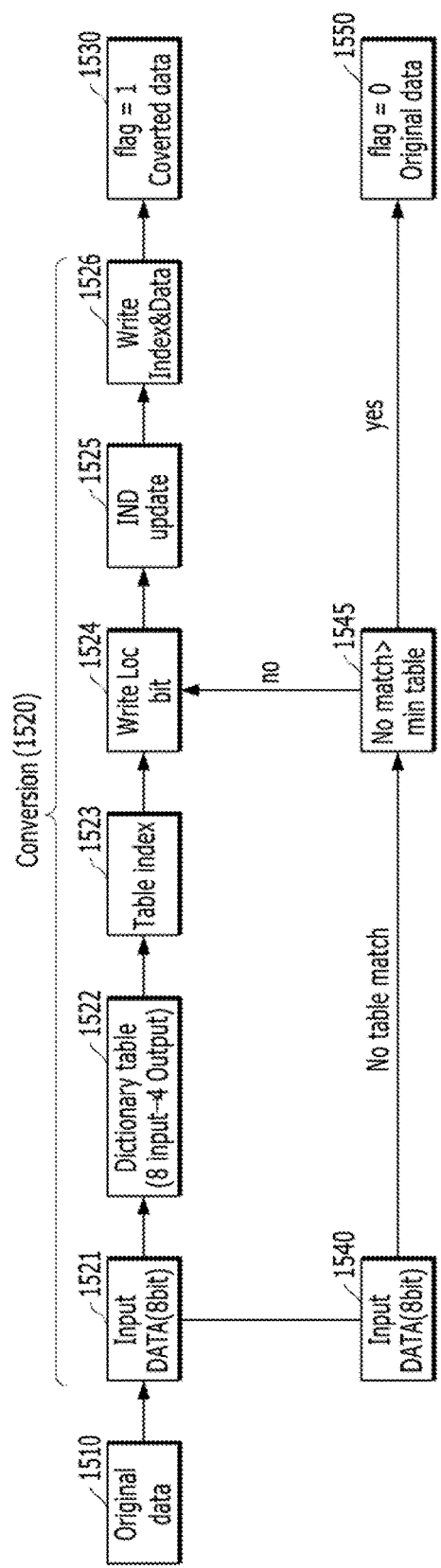
FIG. 15 is a diagram illustrating a data processing flow in a data conversion apparatus in accordance with embodiments.

FIG. 15 is a diagram illustrating a data processing flow in a data conversion apparatus in accordance with an embodiment of the present invention. The data processing flow may correspond to the case in which the controller 520 of the data conversion apparatus 500 illustrated in FIG. 5 selectively converts 512-bit input data and output the converted data as output data.

Referring to FIG. 15, the controller 520 may receive input data at 1510. The controller 520 may selectively convert the input data based on a distribution of a preset bit value included in the input data. In an embodiment, the controller 520 may divide the input data into a plurality of partial data, and convert the partial data based on distributions of "1" bit values included in the respective partial data, or output the partial data without conversion. Also, 1520 and 1530 may correspond to operations of converting the partial data, and 1540, 1545 and 1550 may correspond to operations of outputting the partial data without conversion.

In FIG. 15, 1520 may include 1521 to 1526. At 1521 to 1523, the controller 520 may convert the partial data into index values. For example, the controller 520 may convert 8-bit partial data into 4-bit index values by referring to the dictionary table at 1522, and output the converted table indexes at 1523. The controller 520 may write the corresponding bit in the location information region Loc of the output data at 1524, update the corresponding bits in the indication information region IND of the output data at 1525, and write the corresponding values to the index/data region of the output data at 1526. Since the operation to include the corresponding information in the output data can be performed as described with reference to FIGS. 11 and 12, the detailed descriptions thereof are omitted herein.

At 1530, the controller 520 may set be bit of the flag information region in the output data to "1". As a result, the controller 520 may generate output data including the converted data.

At 1540, 1545 and 1550, the controller 520 may generate output data including the partial data without conversion. Such an operation may be performed when index values corresponding to the partial data are not present in the dictionary table.

Figure 16:
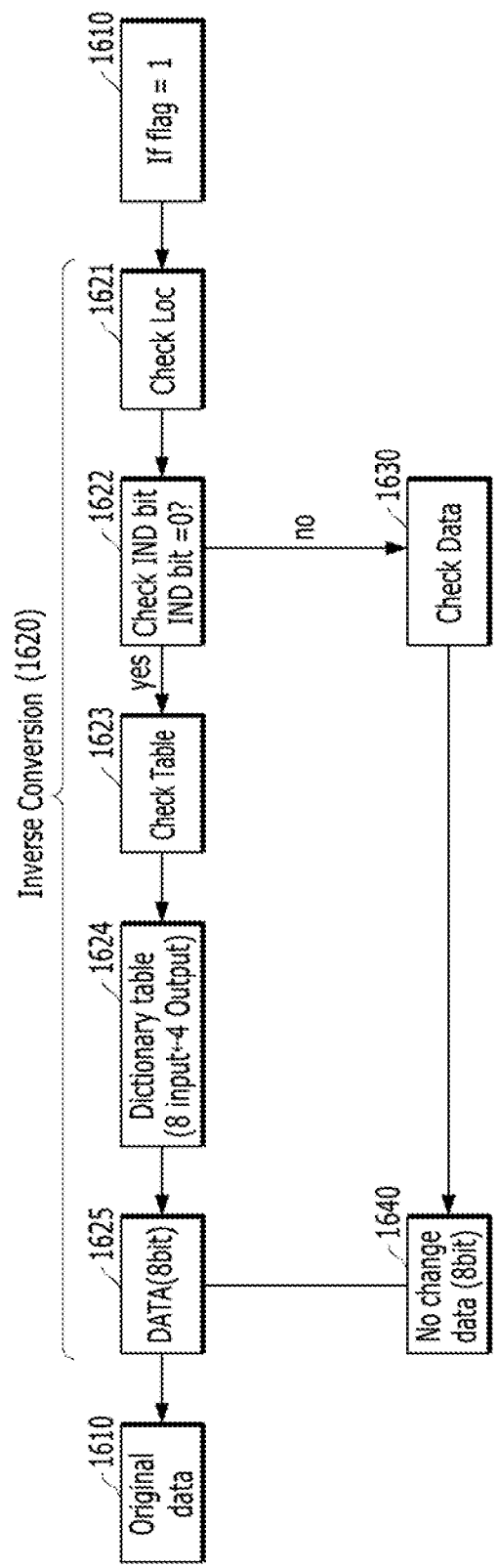
FIG. 16 is a diagram illustrating a data processing flow in a data conversion apparatus in accordance with embodiments.

FIG. 16 is a diagram illustrating a data processing flow in a data conversion apparatus in accordance with an embodiment of the present invention. The data processing flow may correspond to the case in which the controller 520 of the data conversion apparatus 500 illustrated in FIG. 5 restores original data by inversely converting data. The conversion target data may include the data processed through the flow illustrated in FIG. 15.

Referring to FIG. 16, the controller 520 may check the conversion target data at 1610. When the flag information included in the target data has a bit value of "1" an inverse conversion 1620 may be performed as illustrated in FIG. 16. On the other hand, when the flag information included in the target data has a bit value of "0", the target data may be processed without the inverse conversion 1620.

When the flag information is determined to have a bit value of "1", the controller 520 may check the location Information Loc at 1621, and check the bit of the indication information IND at 1622. Based on the bit value of the indication information IND the controller 520 may inversely convert the target data, or restore the original data without conversion.

When the bit value of the indication information IND is determined to be "0" at 1622, the controller 520 may restore decoding data corresponding to the target data at 1623 to 1625. For example, the controller 520 may output 8-bit data corresponding to the 4-bit target data by checking the dictionary table at 1623 and 1624.

When the bit value of the indication information IND is determined to be "1" at 1622, the controller 520 may restore the target data without inverse conversion at 1630 and 1640. For example, the controller 520 may output 8-bit target data without conversion.

At 1640, the controller 520 may restore the original data by gathering results obtained through the operations 1610 to 1625 or the operations 1610 to 1640.

Hereinafter, a data processing system and electronic equipment provided with the memory system 110 including the memory device 150 and the controller 130 described with reference to FIGS. 1 to 16 in accordance with an embodiment will be described in more detail with reference to FIGS. 17 to 25.

FIGS. 17 to 25 are diagrams schematically illustrating application examples of the data processing system of FIG. 1 in accordance with various embodiments of the present disclosure.

Figure 17:
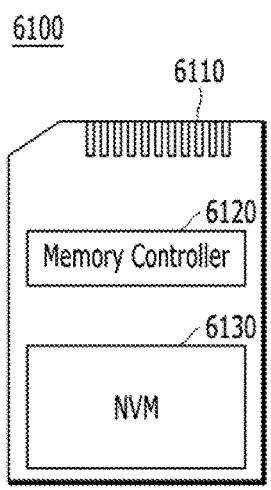
FIGS. 17 to 25 are diagrams schematically illustrating application examples of the data processing system shown in FIG. 1 in accordance with various embodiments of the present invention.

FIG. 17 is a diagram schematically illustrating another example of the data processing system including the memory system in accordance with an embodiment of the present disclosure. FIG. 17 schematically illustrates a memory card system to which the memory system in accordance with an embodiment is applied.

Referring to FIG. 17, the memory card system 6100 may include a connector 6110, a memory controller 6120 and memory device 6130.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM) a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC) peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (WI-FI) and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state drive (SSD) by being integrated into a single semiconductor device. Also, the memory controller 6120 and the memory device 6130 may construct a memory card such as a PC card (e.g., Personal Computer Memory Card International Association (PCM-CIA)), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 18:
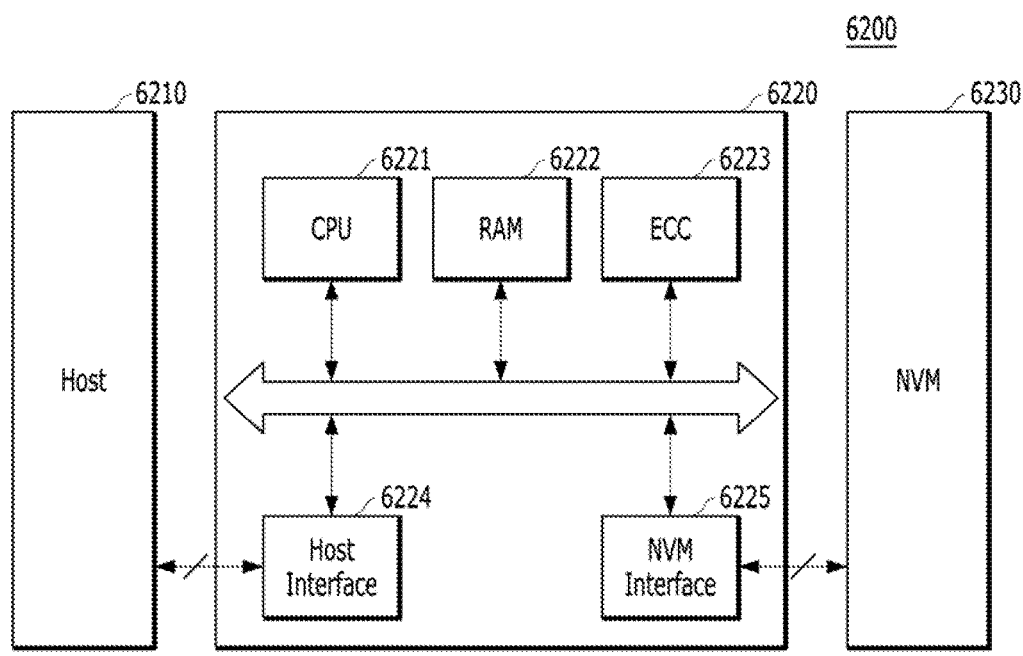

FIG. 18 is a diagram schematically illustrating another example of the data processing system including the memory system in accordance with an embodiment of the present disclosure.

Referring to FIG. 18, the data processing system 6200 may include a memory device 6230 having one or more nonvolatile memories (NVMs) and a memory controller 6220 for controlling the memory device 6230. The data processing system 6200 illustrated in FIG. 13 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include a central processing unit (CPU) 6221, a random access memory (RAM) as a buffer memory 6222, an error correction code (ECC) circuit 6223, a host interface 6224 and an NVM interface as a memory interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using any suitable method including a coded modulation such as a low density parity check (LDPC) code, a Bose-Chaudhuri-Horquenghem (BCH) code, a turbo code, Reed-Solomon (RS) code, a convolution code, a recursive systematic code (RSC), a trellis-coded modulation (TCM) or a Block coded modulation (BCM).

The memory controller 6220 may transmit/receive data to/from the host 6210 through the host interface 6224, and transmit/receive data to/from the memory device 6230 through the NVM interface 6225. The host interface 6224 may be connected to the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. The memory controller 6220 may have a wireless communication function with a mobile communication protocol such as wireless fidelity (WI-FI) or long term evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 19:
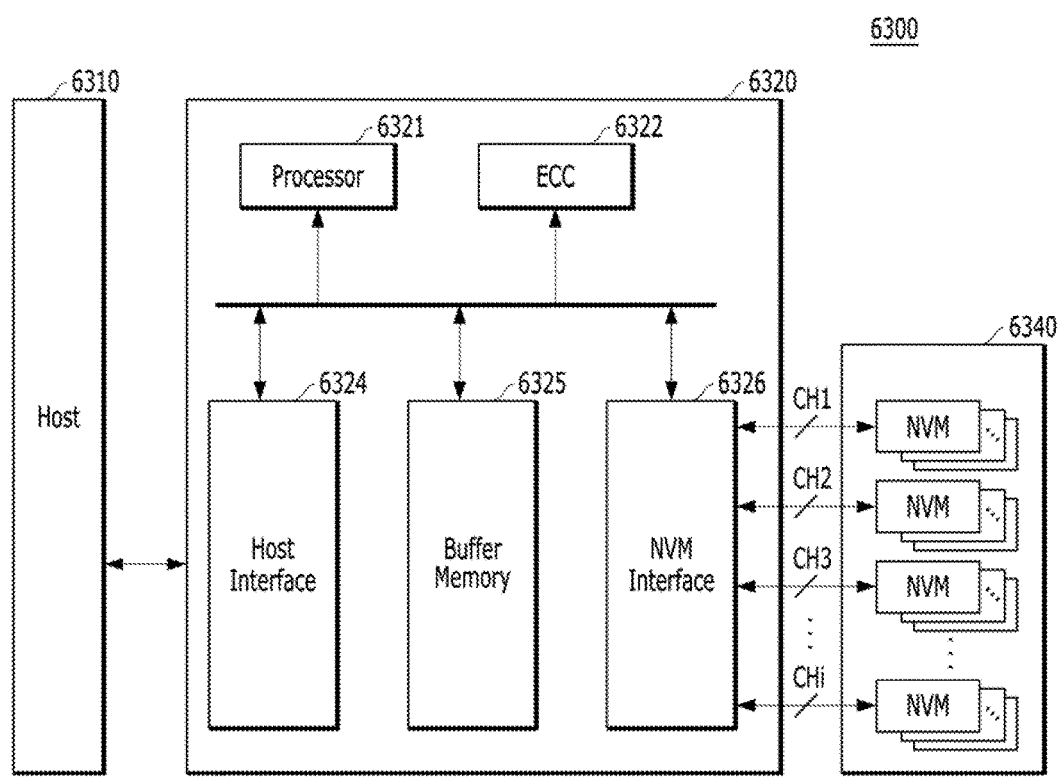

FIG. 19 is a diagram schematically illustrating another example of the data processing system including the memory system in accordance with an embodiment of the present disclosure. FIG. 19 schematically illustrates a solid state drive (SSD) 6300 to which the memory system in accordance with an embodiment is applied.

Referring to FIG. 19, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIG. 1.

More specifically, the controller 6320 may be connected to the memory device 6340 through a plurality of channels CH1 to CHi. The controller 6320 may include a processor 6321, a buffer memory 6325, an error correction code (ECC)

circuit 6322, a host interface 6324 and a nonvolatile memory interface as a memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous dynamic random access memory (SDRAM), a double data rate (DDR) SDRAM, a low power double data rate (LPDDR) SDRAM and graphic random access memory (GRAM) or nonvolatile memories such as a ferroelectric random access memory (FRAM), a resistive random access memory (ReRAM), a spin-transfer torque magnetic random access memory (STT-MRAM) and a phase change random access memory (PRAM). For convenience of description, FIG. 14 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 20:
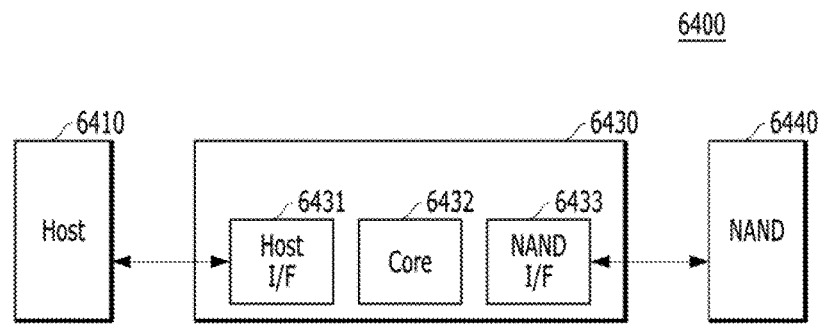

FIG. 20 is a diagram schematically illustrating another example of the data processing system including the memory system in accordance with an embodiment of the present disclosure. FIG. 20 schematically illustrates an embedded Multi-Media Card (eMMC) to which the memory system in accordance with an embodiment is applied.

Referring to FIG. 20, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as, a parallel interface such as an MMC interface as described with reference to FIG. 1. Furthermore the host interface 6431 may serve as a serial interface such as an ultra-high speed class 1 (UHS-I)/UHS class 2 (UHS-II) and a universal flash storage (UFS) interface.

FIGS. 21 to 24 are diagrams schematically illustrating other examples of the data processing system including the memory system in accordance with embodiments of the present disclosure. FIGS. 21 to 24 schematically illustrate universal flash storage (UFS) systems to which the memory system in accordance with an embodiment is applied.

Referring to FIGS. 21 to 24, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 18 to 20, and the UFS cards 6530, 6630, 6730 and 6830 may be embodied in the form of the memory card system 6100 described with reference to FIG. 17.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, USB flash drives (UFDs), multimedia card (MMC), secure digital (SD), mini-SD, and micro-SD.

Figure 21:
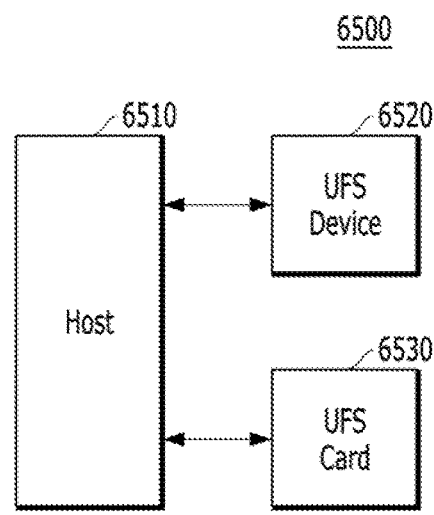

In the UFS system 6500 illustrated in FIG. 21, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 22:
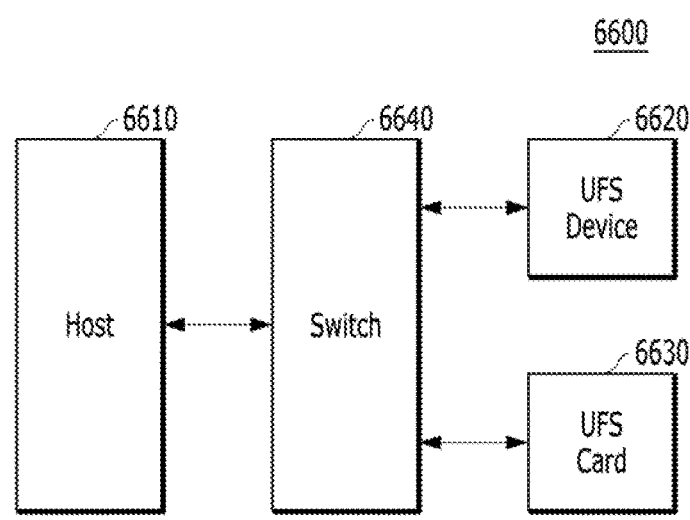

In the UFS system 6600 illustrated in FIG. 22, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 23:
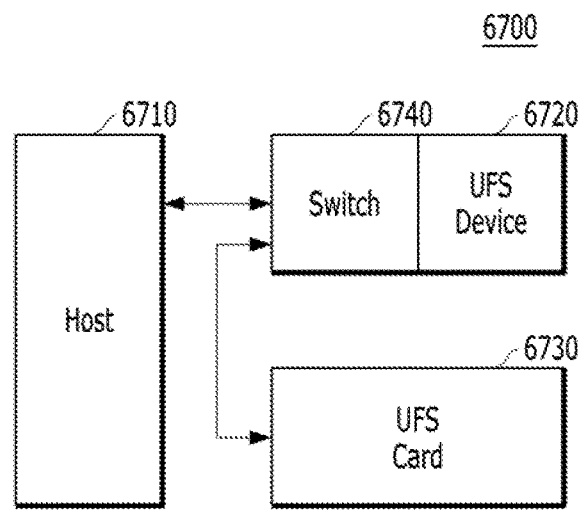

In the UFS system 6700 illustrated in FIG. 23, each of the host 6710 the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 24:
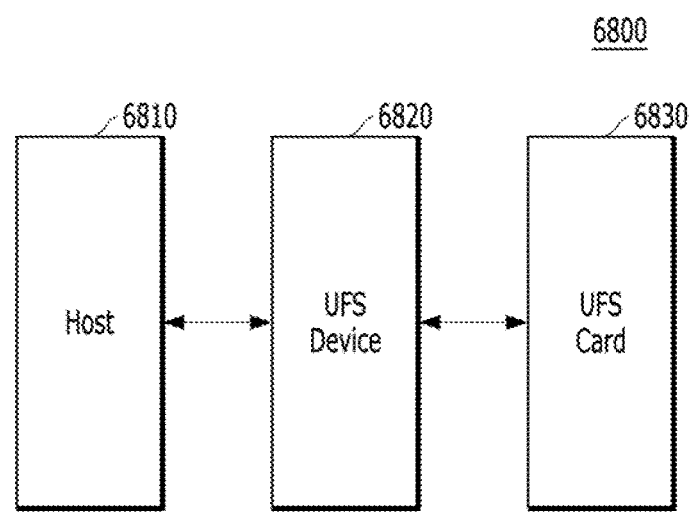

In the UFS system 6800 illustrated in FIG. 24, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 25:
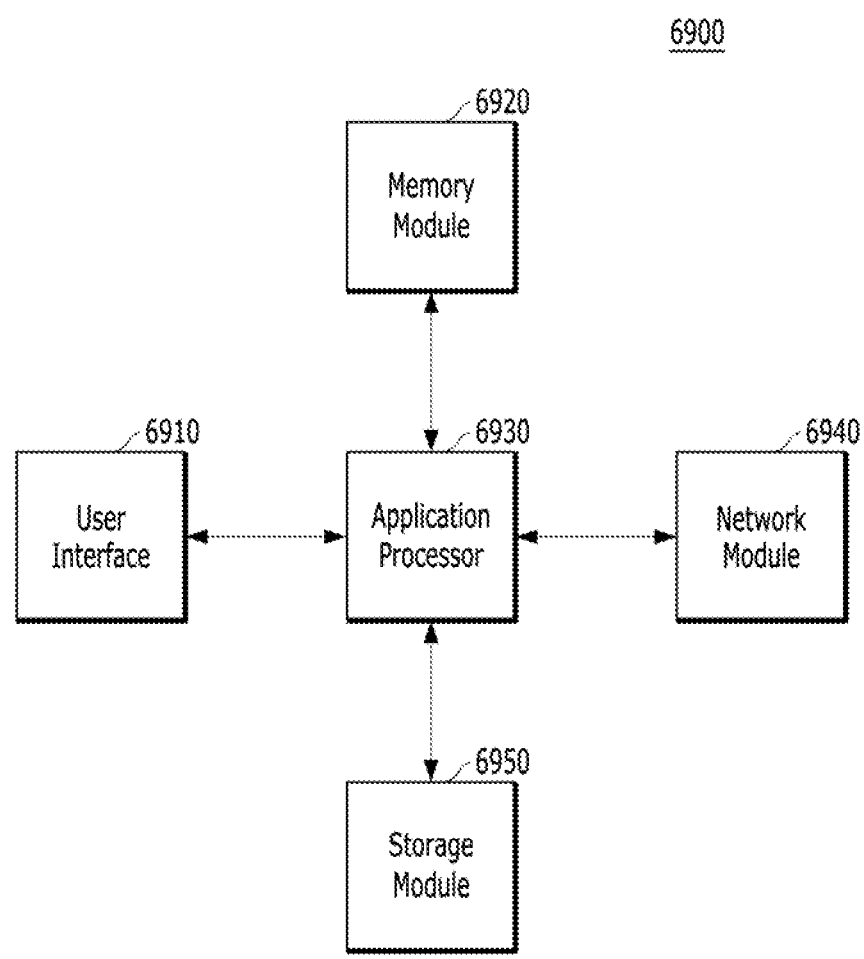

FIG. 25 is a diagram schematically illustrating another example of the data processing system including the memory system in accordance with an embodiment of the present disclosure. FIG. 25 is a diagram schematically illustrating a user system to which the memory system in accordance with an embodiment is applied.

Referring to FIG. 25, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDARM, an LPDDR2 SDRAM and an LPDDR3 SDRAM or a nonvolatile RAM such as a phase change random access memory (PRAM) a resistive random access memory (ReRAM), a magnetic random access memory (MRAM) and a ferroelectric random access memory (FRAM). For example, the application processor 6930 and the memory module 6920 may be packaged and mounted, based on a package-on-package (POP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI) thereby communicating with wired and/or wireless electronic devices or particularly mobile electronic devices. Therefore, the memory system and the data processing system, in accordance with an embodiment of the present invention, can be applied to wired and/or wireless electronic devices. The network module 6940 may be included in the application processor 6930.

The storage module 6950 may store data for example, data provided from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 19 to 24.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED) a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A data conversion apparatus comprising:
a receiver suitable for receiving input data; and
a controller suitable for selectively converting the input data based on a distribution of a preset bit value included in the input data, and outputting any one of the input data and the converted data as output data, the converted data having a smaller size than the input data.

2. The data conversion apparatus of claim 1, wherein the preset bit value comprises a bit value having a logic level of "1", and
when the distribution of the preset bit value included in the input data exceeds a preset ratio, the controller converts the input data, and outputs the output data including the converted data.

3. The data conversion apparatus of claim 2, wherein the output data comprises the converted data and flag information indicating whether the output data include only the input data.

4. The data conversion apparatus of claim 3, further comprising a table suitable for storing index values corresponding to a series of bit values included in the input data,
wherein when the distribution of the preset bit value exceeds the preset ratio, the controller outputs an index value corresponding to a bit value included in the input data as the converted data, based on the table.

5. The data conversion apparatus of claim 1, wherein the preset bit value comprises a bit value having a logic level of "1", and
when the distribution of the preset bit value included in the input data exceeds the preset ratio, the controller divides the input data into a plurality of partial data including first and second partial data, converts the first partial data as the converted data, and outputs the output data including the converted data and the second partial data.

6. The data conversion apparatus of claim 5, wherein the output data comprises:
flag information indicating whether the output data include only the input data;
the converted data;
the second partial data; and
indication information indicating that the first partial data is converted data and the second partial data is non-converted data.

7. The data conversion apparatus of claim 6, further comprising a table suitable for storing index values corresponding to a series of bit values included in each of the plurality of partial data,
wherein when the distribution of the preset bit value exceeds the preset ratio, the controller outputs an index value corresponding to a bit value included in the corresponding partial data as the converted data, based on the table.

8. The data conversion apparatus of claim 6, wherein the output data further comprises padding information.

9. The data conversion apparatus of claim 6, wherein the locations of the converted data, the second partial data and the indication information in the output data are variably set, and
the output data further comprises location information indicating the locations.

10. The data conversion apparatus of claim 9, wherein in the output data,
the converted data and the second partial data are located in a first region, the indication information is located in a second region after the first region, and the location information is located in a third region after the second region, or
the indication information is located in the first region, the converted data and the second partial data are located in the second region after the first region, and the location information is located in the third region after the second region.

11. A data conversion method comprising:
receiving input data;
selectively converting the input data based on a distribution of a preset bit value included in the input data; and
outputting any one of the input data and the converted data as output data, the converted data having a smaller size than the input data.

12. The data conversion method of claim 11, wherein the preset bit value comprises a bit value having a logic level of "1", and
the converting of the input data comprises converting the input data when the distribution of the preset bit value included in the input data exceeds the preset ratio.

13. The data conversion method of claim 12, wherein the output data comprises the converted data and flag information indicating whether the output data include only the input data.

14. The data conversion method of claim 13, wherein the converting of the input data includes outputting an index value corresponding to a bit value included in the input data as the converted data based on a table which stores index values corresponding to a series of bit values included in the input data, when the distribution of the preset bit value exceed the preset ratio.

15. The data conversion method of claim 11, wherein the preset bit value comprises a bit value having a logic level of "1", and
the converting of the input data comprises dividing the input data into a plurality of partial data including first and second partial data and converting the first partial data as the converted data, when the distribution of the preset bit value included in the input data exceeds the preset ratio, and the outputting of any one of the input data and the converted data comprises outputting the output data including the converted data and the second partial data.

16. The data conversion method of claim 15, wherein the output data comprises:
   flag information indicating whether the output data include only the input data;
   the converted data;
   the second partial data; and
   indication information indicating that the first partial data is converted data and the second partial data is non-converted data.

17. The data conversion method of claim 16, wherein the converting of the input data comprises outputting an index value corresponding to a bit value included in the corresponding partial data as the converted data based on a table which stores index values corresponding to a series of bit values included in each of the partial data, when the distribution of the preset bit value exceeds the preset ratio.

18. The data conversion method of claim 16, wherein the output data further comprises padding information.

19. The data conversion method of claim 16, wherein the locations of the converted data, the second partial data and the indication information in the output data are variably set, and
   the output data further comprises location information indicating the locations.

20. The data conversion method of claim 19, wherein in the output data,
   the converted data and the second partial data are located in a first region, the indication information is located in a second region after the first region, and the location information is located in a third region after the second region, or
   the indication information is located in the first region, the converted data and the second partial data are located in the second region after the first region, and the location information is located in the third region after the second region.

* * * * *